(12) United States Patent
Kwon et al.

(10) Patent No.: US 10,128,254 B2
(45) Date of Patent: Nov. 13, 2018

(54) SEMICONDUCTOR DEVICE

(71) Applicant: SAMSUNG ELECTRONICS CO., LTD., Suwon-si, Gyeonggi-Do (KR)

(72) Inventors: Dae-Jin Kwon, Seongnam-si (KR); Kang-Ill Seo, Chungcheongbuk-Do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/187,529

(22) Filed: Jun. 20, 2016

(65) Prior Publication Data

US 2017/0365611 A1  Dec. 21, 2017

(51) Int. Cl.
| | |
|---|---|
| *H01L 29/423* | (2006.01) |
| *H01L 27/11* | (2006.01) |
| *H01L 23/528* | (2006.01) |
| *H01L 29/78* | (2006.01) |

(52) U.S. Cl.
CPC ........ *H01L 27/1104* (2013.01); *H01L 23/528* (2013.01); *H01L 29/42356* (2013.01); *H01L 29/42392* (2013.01); *H01L 29/785* (2013.01); *H01L 29/7827* (2013.01)

(58) Field of Classification Search
CPC ............................................... H01L 29/42392
See application file for complete search history.

(56) References Cited

U.S. PATENT DOCUMENTS

| | | | |
|---|---|---|---|
| 7,368,788 B2 | 5/2008 | Huo et al. | |
| 7,521,766 B2 | 4/2009 | Yoon et al. | |
| 7,981,738 B2 | 7/2011 | Moniwa et al. | |
| 8,039,893 B2 * | 10/2011 | Masuoka | H01L 27/092 257/329 |
| 8,445,384 B2 | 5/2013 | Dixit | |
| 8,750,027 B2 | 6/2014 | Kim | |
| 8,863,063 B2 | 10/2014 | Becker et al. | |
| 8,964,457 B2 | 2/2015 | Liaw | |
| 2007/0090466 A1 * | 4/2007 | Park | H01L 21/28525 257/382 |
| 2007/0114612 A1 | 5/2007 | Ahn et al. | |
| 2011/0024828 A1 * | 2/2011 | Takeuchi | H01L 27/0207 257/329 |
| 2012/0181618 A1 * | 7/2012 | Masuoka | H01L 21/823487 257/369 |
| 2012/0181622 A1 | 7/2012 | Masuoka et al. | |
| 2013/0069149 A1 * | 3/2013 | Masuoka | H01L 21/84 257/330 |
| 2013/0292777 A1 | 11/2013 | Liaw | |
| 2014/0131813 A1 | 5/2014 | Liaw | |

(Continued)

*Primary Examiner* — Benjamin Sandvik
(74) *Attorney, Agent, or Firm* — F. Chau & Associates, LLC

(57) ABSTRACT

A semiconductor device includes a substrate, a first pattern, a first gate electrode, and a second pattern. The first pattern is disposed on the substrate and extends in a first direction substantially vertical to an upper surface of the substrate, and includes a first part, a second part and a third part sequentially disposed on the substrate. The first gate electrode is connected to the second part and extends in a second direction different from the first direction. The second pattern is disposed on the substrate, extends in the first direction, is connected to the first part, and does not contact the first gate electrode.

18 Claims, 18 Drawing Sheets

(56) References Cited

U.S. PATENT DOCUMENTS

| | | |
|---|---|---|
| 2015/0008533 A1 | 1/2015 | Liaw |
| 2015/0029785 A1 | 1/2015 | Liaw |
| 2015/0056770 A1 | 2/2015 | Ng et al. |
| 2015/0179655 A1* | 6/2015 | Nakanishi ........... H01L 51/0575 257/9 |
| 2016/0063163 A1* | 3/2016 | Moroz ................ H01L 29/0676 716/110 |
| 2016/0078922 A1* | 3/2016 | Liaw ................. H01L 29/66666 365/51 |

* cited by examiner

1200

1300

SEMICONDUCTOR DEVICE

TECHNICAL FIELD

The present inventive concept relates to a semiconductor device.

DISCUSSION OF THE RELATED ART

Utilization of a vertical metal-oxide-semiconductor field-effect transistor (MOSFET) having a vertical channel is one of a plurality of scaling techniques for increasing integrated circuit device density.

In comparison to conventional transistors having a horizontal channel, the vertical MOSFET may constitute a static random-access memory (SRAM) cell having a smaller area. In addition, the width and length of the vertical channel can be adjusted to control a current ratio between transistors.

SUMMARY

Exemplary embodiments of the present inventive concept provide a semiconductor device including an SRAM cell formed of a vertical MOSFET, allowing for the manufacture of an SRAM cell having a fine cell size.

According to an exemplary embodiment, a semiconductor device includes a substrate, a first pattern, a first gate electrode, and a second pattern. The first pattern is disposed on the substrate and extends in a first direction substantially vertical to an upper surface of the substrate, and includes a first part, a second part and a third part sequentially disposed on the substrate. The first gate electrode is connected to the second part and extends in a second direction different from the first direction. The second pattern is disposed on the substrate, extends in the first direction, is connected to the first part, and does not contact the first gate electrode.

In an exemplary embodiment, the semiconductor device includes a first impurity region formed in the third part, and a second impurity region formed in the second pattern.

In an exemplary embodiment, the semiconductor device includes a first gate contact formed on the first gate electrode. The first gate contact, the first pattern, and the second pattern are sequentially disposed in the second direction.

In an exemplary embodiment, the semiconductor device includes a first gate contact formed on the first gate electrode. The first pattern, the first gate contact, and the second pattern are sequentially disposed in the second direction.

In an exemplary embodiment, the semiconductor device includes a third pattern disposed on the substrate. The third pattern extends in the first direction, and the third pattern includes a fourth part, a fifth part and a sixth part sequentially disposed on the substrate. The semiconductor device further includes a second gate electrode covering a side surface of the fifth part, and a fourth pattern disposed on the substrate. The fourth pattern does not contact the second gate electrode, and extends in the first direction.

In an exemplary embodiment, a thickness of the first pattern and a thickness of the third pattern are different from each other.

In an exemplary embodiment, a thickness of the first gate electrode in the first direction is different from a thickness of the second gate electrode in the first direction.

According to an exemplary embodiment of the present inventive concept, a semiconductor device includes a static random-access memory (SRAM) cell including a first pullup transistor, a first pulldown transistor and a first pass transistor formed on a substrate. The first pulldown transistor includes a first pattern extending in a first direction substantially vertical to an upper surface of the substrate, a first gate electrode that covers a part of the first pattern, and a second pattern that does not contact the first gate electrode that extends in the first direction and that has a first common drain formed therein. The first pullup transistor, the first pulldown transistor and the first pass transistor share the second pattern.

In an exemplary embodiment, the first pullup transistor includes a third pattern extending in the first direction and a second gate electrode that covers a part of the third pattern, and the first pass transistor includes a fourth pattern extending in the first direction and a third gate electrode that covers a part of the fourth pattern.

In an exemplary embodiment, the first pullup transistor and the first pulldown transistor are disposed at one side of the second pattern, and the first pass transistor is disposed at another side of the second pattern that faces the one side of the second pattern.

In an exemplary embodiment, the semiconductor device includes a second pullup transistor, a second pulldown transistor and a second pass transistor. The second pulldown transistor includes a third pattern extending in the first direction, a second gate electrode that covers a part of the third pattern, and a fourth pattern that does not contact the second gate electrode, that extends in the first direction, and that has a second common drain formed therein. The second pullup transistor, the second pulldown transistor and the second pass transistor share the fourth pattern.

In an exemplary embodiment, the second pullup transistor and the second pulldown transistor are disposed at one side of the fourth pattern, the fourth pattern is disposed adjacent to the second pattern, and the fourth pattern and the second pattern are disposed in a substantially straight line in a second direction that extends substantially vertical to the first direction.

In an exemplary embodiment, the second pulldown transistor includes a first gate contact formed on the second gate electrode. The second pullup transistor includes a fifth gate electrode, and a second gate contact formed on the fifth gate electrode. The first gate electrode, the second gate contact, and the fourth pattern are disposed in a substantially straight line in a second direction that extends substantially vertical to the first direction.

In an exemplary embodiment, the first pass transistor is disposed adjacent to one side of the second pullup transistor, and the second pass transistor is disposed adjacent to one side of the first pullup transistor.

In an exemplary embodiment, the semiconductor device includes a second pulldown transistor including a second gate electrode, and a first gate contact formed on the second gate electrode. The semiconductor device further includes a second pullup transistor including a third gate electrode, and a second gate contact formed on the third gate electrode. The semiconductor device further includes a second pass transistor including a fourth gate electrode, and a third gate contact formed on the fourth gate electrode. The first pullup transistor, the first pulldown transistor and the first pass transistor are disposed at one side of the second pattern. The first gate contact, the second gate contact, the third gate contact, and the second pattern are disposed substantially in a straight line in a second direction that extends substantially vertical to the first direction.

According to an exemplary embodiment of the present inventive concept, a semiconductor device includes a substrate, a conductive region disposed in the substrate, an insulating layer disposed on the substrate, a first pattern, a second pattern, and a gate electrode. The first pattern is formed in the insulating layer and contacts a first portion of the conductive region. The first pattern extends lengthwise in a first direction substantially vertical to an upper surface of the substrate. The second pattern is formed in the insulating layer and contacts a second portion of the conductive region. The second pattern extends lengthwise in the first direction. The gate electrode extends lengthwise in a second direction that crosses the first direction, is connected to the first pattern, and does not contact the second pattern.

In an exemplary embodiment, the first pattern, the second pattern, and the substrate are formed of a same material.

In an exemplary embodiment, the semiconductor device includes a source electrode disposed on the first pattern, and the second pattern is a common drain.

In an exemplary embodiment, the semiconductor device includes a first gate contact formed on the first gate electrode. The first gate contact, the first pattern, and the second pattern are sequentially disposed in the second direction.

In an exemplary embodiment, the semiconductor device includes a first gate contact formed on the first gate electrode. The first pattern, the first gate contact, and the second pattern are sequentially disposed in the second direction.

DETAILED DESCRIPTION OF THE EXEMPLARY EMBODIMENTS

Figure 1:
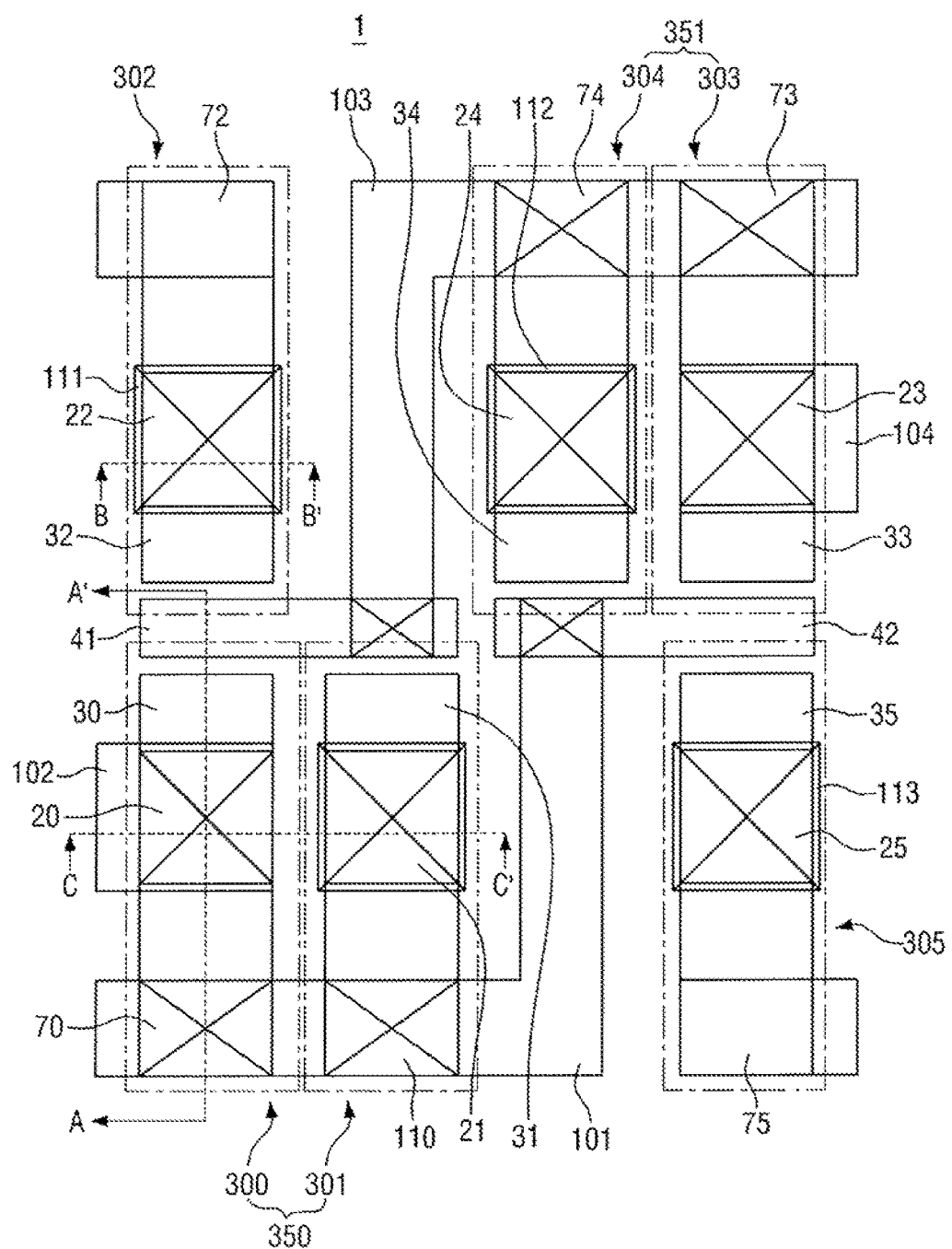
FIG. 1 is a layout diagram of a semiconductor device according to an exemplary embodiment of the present inventive concept.

Exemplary embodiments of the present inventive concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that, although the terms first, second, etc. may be used herein to describe various elements, these elements should not be limited by these terms. These terms are only used to distinguish one element from another. For example, a first part could be termed a second part, and, similarly, a second part could be termed a first part without departing from the teachings of the present inventive concept.

Herein, when two or more components are described as being disposed in substantially a straight line, it is to be understood that the two or more components are disposed in exactly a straight line, or are disposed in approximately a straight line as would be understood by a person having ordinary skill in the art. Further, when two directions or components are described as extending or being arranged substantially parallel or perpendicular to each other, it is to be understood that the two directions or components extend or are arranged exactly parallel or perpendicular to each other, or extend or are arranged approximately parallel or perpendicular to each other as would be understood by a person having ordinary skill in the art. Further, when a first component is described as extending in a direction substantially vertical to a second component, it is to be understood that the first component extends in a direction exactly vertical to the second component, or approximately vertical to the second component as would be understood by a person having ordinary skill in the art. Further, when two or more components are described as being formed of the same material, it is to be understood that the two or more components are formed of an identical material or similar materials as would be understood by a person having ordinary skill in the art. Further, when two components are described as being adjacent to each other, it is to be understood that the two components are directly adjacent to each other or are adjacent to each other such that intervening components are present.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
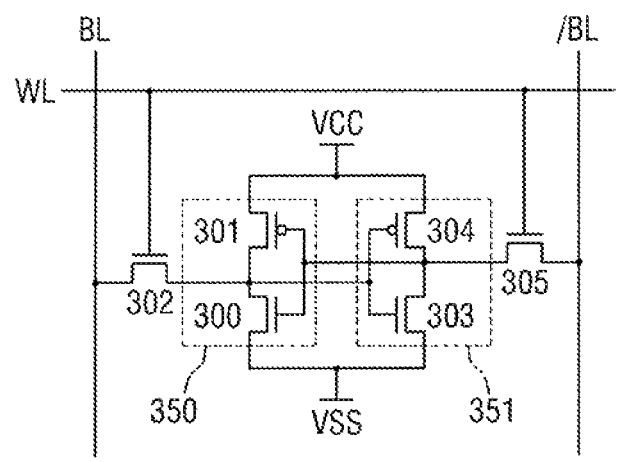
FIG. 2 is a circuit diagram of the semiconductor device according to an exemplary embodiment of the present inventive concept.

FIG. 1 is a layout diagram of a semiconductor device according to an exemplary embodiment of the present inventive concept. FIG. 2 is a circuit diagram of the semiconductor device according to an exemplary embodiment of the present inventive concept.

For convenience of description, bitline and complementary bitline nodes BL and /BL, power and ground nodes VCC and VSS, wordline WL, and contacts connected thereto, which are shown in FIG. 2, are not shown in FIG. 1.

Referring to FIGS. 1 and 2, a semiconductor device 1 according to an exemplary embodiment of the present inventive concept may include a static random-access memory (SRAM) cell. The semiconductor device 1 may include, for example, a pair of inverters 350 and 351 connected between the power node VCC and the ground node VSS, and a first pass transistor 302 and a second pass transistor 305 connected to the respective output nodes of the inverters 350 and 351. The first pass transistor 302 and the second pass transistor 305 may be connected to the respective bitline BL and complementary bitlines /BL. Gates of the first pass transistor 302 and the second pass transistor 305 may be connected to a wordline WL.

The first inverter 350 may include, for example, a first pullup transistor 301 and a first pulldown transistor 300 connected in series. The second inverter 351 may include a second pullup transistor 304 and a second pulldown transistor 303 connected in series. The first pullup transistor 301 and the second pullup transistor 304 may be, for example, a p-type metal-oxide semiconductor (PMOS) transistor, and the first pulldown transistor 300 and the second pulldown transistor 303 may be, for example, an n-type metal-oxide semiconductor (NMOS) transistor.

An input node of the first inverter 350 is connected to an output node of the second inverter 351, and an input node of the second inverter 351 is connected to an output node of the first inverter 350, so as to constitute a single latch circuit with the first inverter 350 and the second inverter 351.

The first pass transistor 302 and the first inverter 350 may share a first common drain 41. The first pulldown transistor 300 may include a second pattern, and the first pullup transistor 301 and the first pass transistor 302 may include the second pattern as a same drain region. That is, the second pattern is shared as the first common drain 41, thereby reducing the area of the semiconductor device 1. Thus, herein, the common drain 41 may also be referred to as the second pattern 41. Further, the terms "common drain" and "pattern" may be used interchangeably herein.

A source contact 111 may be formed on a source electrode 22 of the first pass transistor 302. The source contact 111 may electrically connect the source electrode 22 and the bitline BL.

A source contact 113 may be formed on a source electrode 25 of the second pass transistor 305. The source contact may electrically connect the source electrode 25 of the second pass transistor 305 and the complementary bitline nodes/BL.

The first common drain 41 and a second common drain 42 may be disposed in a substantially straight line. That is, the second common drain 42 may be disposed in a substantially straight line region to which the first common drain 41 extends.

The first gate electrode 30 of the first pulldown transistor 300 may be electrically connected to the second common drain 42 through a gate contact 70. A second gate electrode 31 of the first pullup transistor 301 may be electrically connected to the second common drain 42 through a gate contact 110.

A source electrode 24 of the second pullup transistor 304 may be electrically connected to the power node VCC through a source contact 112.

Figure 3:
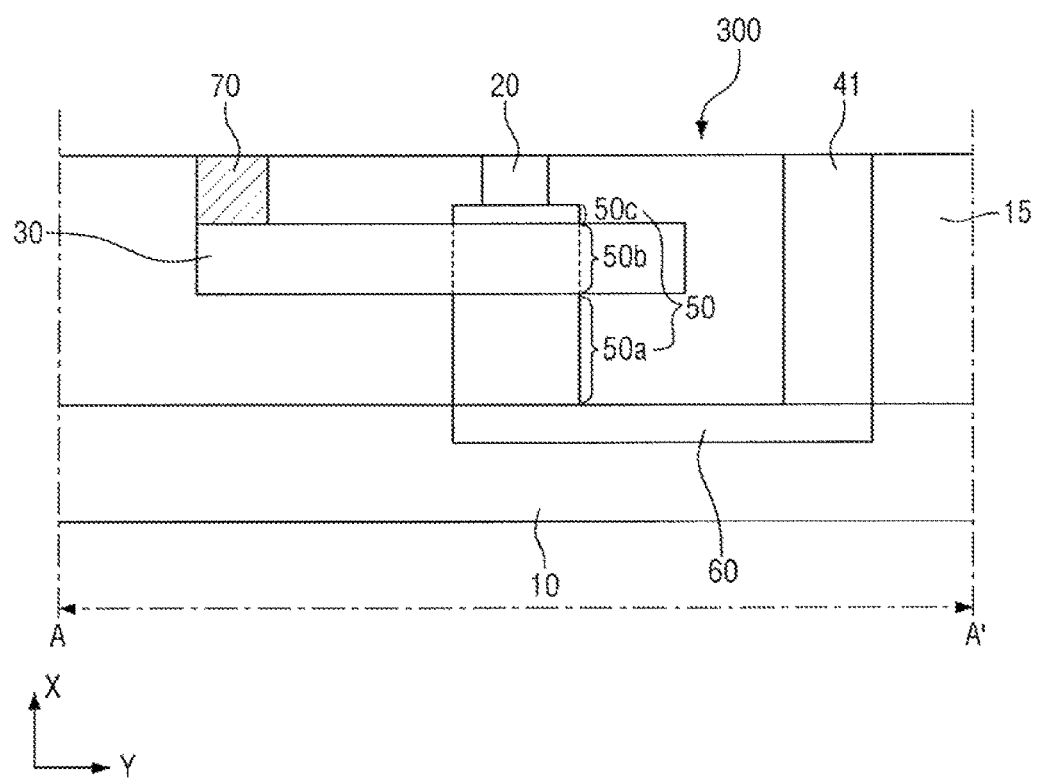
FIG. 3 is a cross-sectional view taken along line A-A' of FIG. 1 according to an exemplary embodiment of the present inventive concept.

FIG. 3 is a cross-sectional view taken along line A-A' of FIG. 1 according to an exemplary embodiment of the present inventive concept.

Referring to FIG. 3, the first pulldown transistor 300 may be a transistor having a vertical channel. The first pulldown transistor 300 may include a substrate 10, an interlayer insulating layer 15, a first source electrode 20, a first gate electrode 30, a first pattern 50, the second pattern 41 and a conductive region 60. The first gate electrode may extend in the second direction Y (e.g., may extend lengthwise in the second direction Y).

The substrate 10 may be, for example, a bulk silicon substrate or a silicon-on-insulator (SOI). The substrate 10 may be, for example, a silicon substrate, or may include other materials such as, for example, silicon germanium, indium antimonide, lead telluride, indium arsenide, indium phosphide, gallium arsenide or gallium antimonide. The substrate 10 may be, for example, an epitaxial layer formed on a base substrate. In the semiconductor device according to an exemplary embodiment of the present inventive concept, the substrate 10 is described herein as being a silicon substrate.

However, the substrate 10 is not limited thereto.

The first pattern 50 may extend in a first direction X substantially vertical to an upper surface of the substrate 10. That is, the first pattern may extend lengthwise in the first direction X. The first pattern 50 may be divided into a first part 50a, a second part 50b and a third part 50c, in order of proximity to an upper surface of the substrate 10, as shown in FIG. 3.

Although the semiconductor device 1 according to an exemplary embodiment of the present inventive concept is shown as having a rectangular pillar shape, the present inventive concept is not limited thereto. For example, in an exemplary embodiment, the first pattern 50 may have an upper surface shaped as a circle.

The second part 50b may be electrically connected to the first gate electrode 30. When a voltage about equal to or higher than a threshold voltage is applied to the first gate electrode 30, a channel region may be formed in the second part 50b.

In an exemplary embodiment of the present inventive concept, since the second part 50b may have a gate-all-around structure enclosed by the first gate electrode 30, a channel region may be formed on all sides which the second part 50b and the first gate electrode 30 contact, thereby reducing a short channel effect.

The third part 50c may be doped with impurities, thereby forming an impurity region therein. The third part 50c in which the impurity region is formed may have a source/drain formed therein.

Since the first pulldown transistor 300 may be an NMOS transistor, the first pattern 50 may be the same material as that of the substrate 10 or a tensile stress material. For example, when the substrate 10 is formed of Si, the first pattern 50 may be formed of Si or a material (for example, SiC) having a lattice constant smaller than that of Si. The tensile stress material may apply tensile stress to a channel region, which may improve carrier mobility in the channel region.

The first source electrode 20 may be formed on the first pattern 50. The first source electrode 20 may electrically connect the first pattern 50 and the bitline BL.

The first source electrode 20 may include a conductive material. In exemplary embodiments of the present inventive concept, the conductive material may include, for example, at least one among polycrystalline silicon, a metal silicide compound, a conductive metal nitride, and metal. However, the present inventive concept is not limited thereto.

The first gate electrode 30 may be connected to the first pattern 50 and may extend in a second direction different from the first direction. For example, the first gate electrode 30 may extend in a second direction Y that crosses the first direction X (e.g., a direction that is substantially perpendicular to the first direction X). The first gate electrode 30 may be connected to the second part 50b of the first pattern 50. When the first gate electrode 30 is connected to the second part 50b, and a voltage about equal to or higher than a threshold voltage is applied to the first gate electrode 30, a channel may be formed on the second part 50b.

The first gate electrode 30 may be formed of, for example, doped polysilicon, titanium nitride (TiN), tantalum nitride (TaN), tungsten nitride (WN), titanium (Ti), tantalum (Ta), tungsten (W), etc. However, the present inventive concept is not limited thereto.

The first gate electrode 30 may be connected to the second part 50b, to thereby form a gate-all-around structure enclosing the second part 50b and a channel formed therein.

Referring to a comparative example, as the degree of integration of a semiconductor device increases, a gate length may become shorter, and thus, a channel length may also become shorter. The shortened channel length of a transistor may increase a short channel effect, thereby degrading characteristics of the transistor.

In the semiconductor device 1 according to an exemplary embodiment of the present inventive concept, when the first gate electrode 30 has a gate-all-around structure, all sides of the second part 50b may be used as a channel region. This may result in improvements relating to drawbacks in an existing planar transistor such as, for example, the planar transistor having a channel on only one side thereof, or a lower part of a fin in a finFET not being used as a channel. Thus, operating characteristics of a semiconductor device may be improved according to exemplary embodiments of the present inventive concept.

A gate insulating layer may be interposed between the first gate electrode 30 and the second part 50b. The gate insulating layer may include a high dielectric constant material having a dielectric constant higher than that of a silicon oxide layer. For example, the gate insulating layer may include materials such as $HfO_2$, $ZrO_2$ or $Ta_2O_5$.

The second pattern 41 may be disposed on the substrate 10 and may extend in the first direction X from the substrate 10 (e.g., the second pattern 41 may extend lengthwise in the first direction X). The second pattern 41 may be formed of a material substantially the same as that of the first pattern 50.

The second pattern 41 may include an impurity region doped with impurities. The second pattern 41 having the impurity region formed therein may include a source/drain region.

The conductive region 60 may include a conductive material. In exemplary embodiments of the present inventive concept, the conductive material may include, for example, at least one among polycrystalline silicon, a metal silicide compound, conductive metal nitride, and metal. However, the present inventive concept is not limited thereto. The conductive region 60 may electrically connect the first part 50a of the first pattern 50 and the second pattern 41. The second pattern 41 does not contact (e.g., does not directly contact) the first gate electrode 30.

Figure 4:
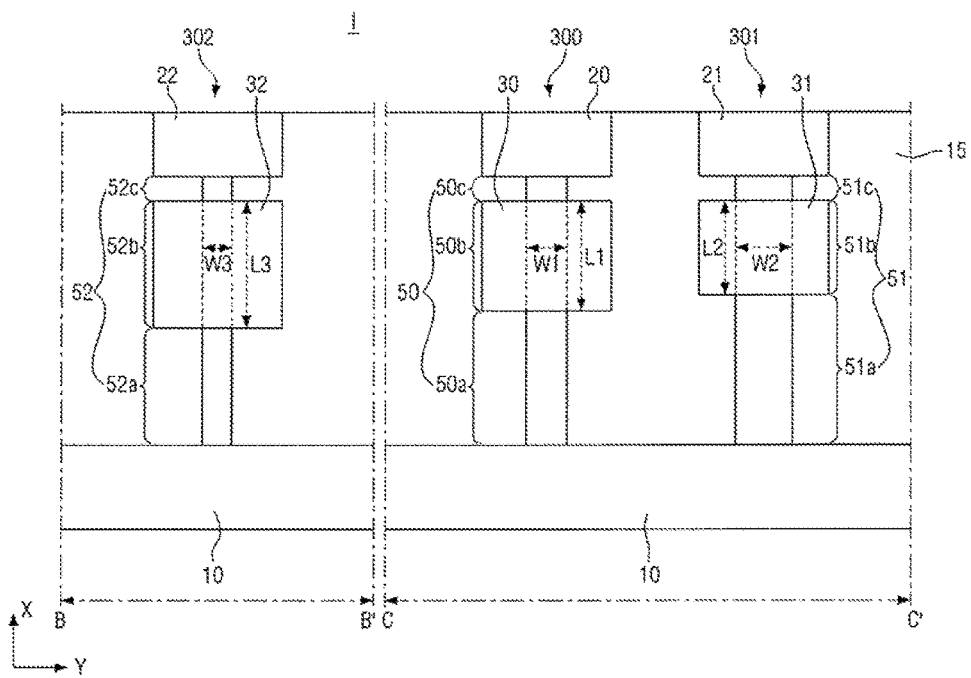
FIG. 4 is a cross-sectional view taken along lines B-B' and C-C' of FIG. 1 according to an exemplary embodiment of the present inventive concept.

FIG. 4 is a cross-sectional view taken along lines B-B' and C-C' of FIG. 1 according to an exemplary embodiment of the present inventive concept.

Since the first pullup transistor 301 is a PMOS transistor, a third pattern 51 may include a compressive stress material.

The compressive stress material may be, for example, a material having a lattice constant higher than that of Si (e.g., SiGe). The third pattern 51 may include a first part 51a, a second part 51b, and a third part 51c. The third pattern 51 may extend in the first direction X (e.g., the third pattern 51 may extend lengthwise in the first direction X).

The compressive stress material may apply compressive stress to the second part 51b of the third pattern 51, which may improve carrier mobility in a channel region.

Thus, the operating efficiency of a semiconductor device may be improved.

The first pattern 50, the third pattern 51 and a fourth pattern 52 may have thicknesses different from each other. The fourth pattern 52 may include a first part 52a, a second part 52b, and a third part 52c.

For example, in an exemplary embodiment, a thickness w1 of the first pattern 50 may be larger than a thickness w3 of the fourth pattern 52, and may be, for example, about 1.2 or more times larger than the thickness w3.

As a result, the width of a channel of the first pulldown transistor 300 is wider than the width of a channel of the first pass transistor 302 in an SRAM cell of the semiconductor device 1 according to an exemplary embodiment of the present inventive concept. That is, the disturb margin related to an SRAM read operation may depend on the beta ratio which is a current ratio of the first pulldown transistor 300 to the first pass transistor 302. To ensure a sufficient margin, the magnitude of the beta ratio may be about 1.2 or higher.

Thus, the beta ratio may be adjusted by adjusting the thickness w1 of the first pattern 50 and the thickness w3 of the fourth pattern 52 with other conditions set to be the same when designing an SRAM cell.

A method of adjusting the number of fins connected to a gate electrode has often been used to adjust a beta ratio in conventional FinFET structures. However, this approach may have drawbacks relating to the amount that the beta ratio may be adjusted by.

When manufacturing the semiconductor device 1 according to an exemplary embodiment of the present inventive concept, the thickness w1 of the first pattern 50 and the thickness w3 of the fourth pattern 52 may be adjusted to set the beta ratio in an improved manner (e.g., to adjust the beta ratio by a larger amount compared to conventional FinFET structures). Thus, according to exemplary embodiments, the SRAM yield can be adjusted in an improved manner.

The thickness w2 of the third pattern 51 may be larger than the thickness w3 of the fourth pattern 52, and may be, for example, about 2 or more times wider than the thickness w3.

As a result, the width w3 of the channel of the first pullup transistor 301 is wider than the width w3 of the channel of the first pass transistor 302 in the SRAM cell of the semiconductor device 1 according to an exemplary embodiment of the present inventive concept. That is, the disturb margin related to an SRAM write operation may depend on the gamma ratio which is a current ratio of the first pullup transistor 301 to the first pass transistor 302. To ensure a sufficient margin, the magnitude of the gamma ratio may be about 2 or higher.

Thus, the gamma ratio may be adjusted by adjusting the thickness w2 of the third pattern 51 and the thickness w3 of the fourth pattern 52 with other conditions set to be the same when designing an SRAM cell.

In the semiconductor device 1 according to an exemplary embodiment of the present inventive concept, the width w2 of the third pattern 51 and the width w3 of the fourth pattern 52 may be adjusted to adjust the gamma ratio. As a result, according to exemplary embodiments, the gamma ratio may be set in an improved manner (e.g., the gamma ratio may be adjusted by a large amount). Thus, according to exemplary embodiments, the SRAM yield can be adjusted in an improved manner.

According to an exemplary embodiment, a length L1 extending in the first direction X in an area in which the second part 50b of the first pattern 50 and the first gate electrode 30 are overlapped with each other, a length L2 extending in the first direction X in an area in which the second part 51b of the third pattern 51 and a second gate electrode 31 are overlapped with each other, and a length L3 extending in the first direction X in an area in which the second part 52b of the fourth pattern 52 and a third gate electrode 32 are overlapped with each other may be different from one another. As shown in FIG. 4, the first gate electrode 30 is adjacent to and covers a side surface of the second part 50b of the first pattern, the second gate electrode 31 is adjacent to and covers a side surface of the second part 51b of the third pattern 51, and the third gate electrode 32 is adjacent to and covers a side surface of the second part 52b of the fourth pattern 54. In addition, the fourth pattern 52 does not contact the second gate electrode 31 and extends in the first direction X (e.g., extends lengthwise in the first direction X).

For example, the length L3 of the second part 52b of the fourth pattern 52 may be longer than the length L1 of the second part 50b of the first pattern 50 and longer than the length L3 of the of the second part 52b of the fourth pattern. In an exemplary embodiment, the length L3 may be about 1.2 or more times longer than the length L3.

A length of a region in which a channel is formed may be adjusted to adjust the beta ratio of an SRAM as described above. For example, in the case of applying the same voltage, when the length of the channel is elongated, a resistance in a channel region may increase to reduce the current flowing through the channel region.

Thus, in the semiconductor device 1 according to an exemplary embodiment of the present inventive concept, the length of the channel region may be adjusted through the adjustment of the length of the gate electrodes 30 and 32 in the first direction X, thereby adjusting the beta ratio of the SRAM cell.

In an exemplary embodiment, the length L3 of the second part 52b of the fourth pattern 52 may be longer than the length L2 of the second part 51b of the third pattern 51. For example, in an exemplary embodiment, the length L3 may be about 2 or more times longer than the length L1.

To adjust the gamma ratio of the SRAM as described above, the length of the gate electrodes 31 and 32 in the first direction X may be adjusted to thereby adjust the current ratio between the first pass transistor 302 and the first pullup transistor 301.

Figure 5:
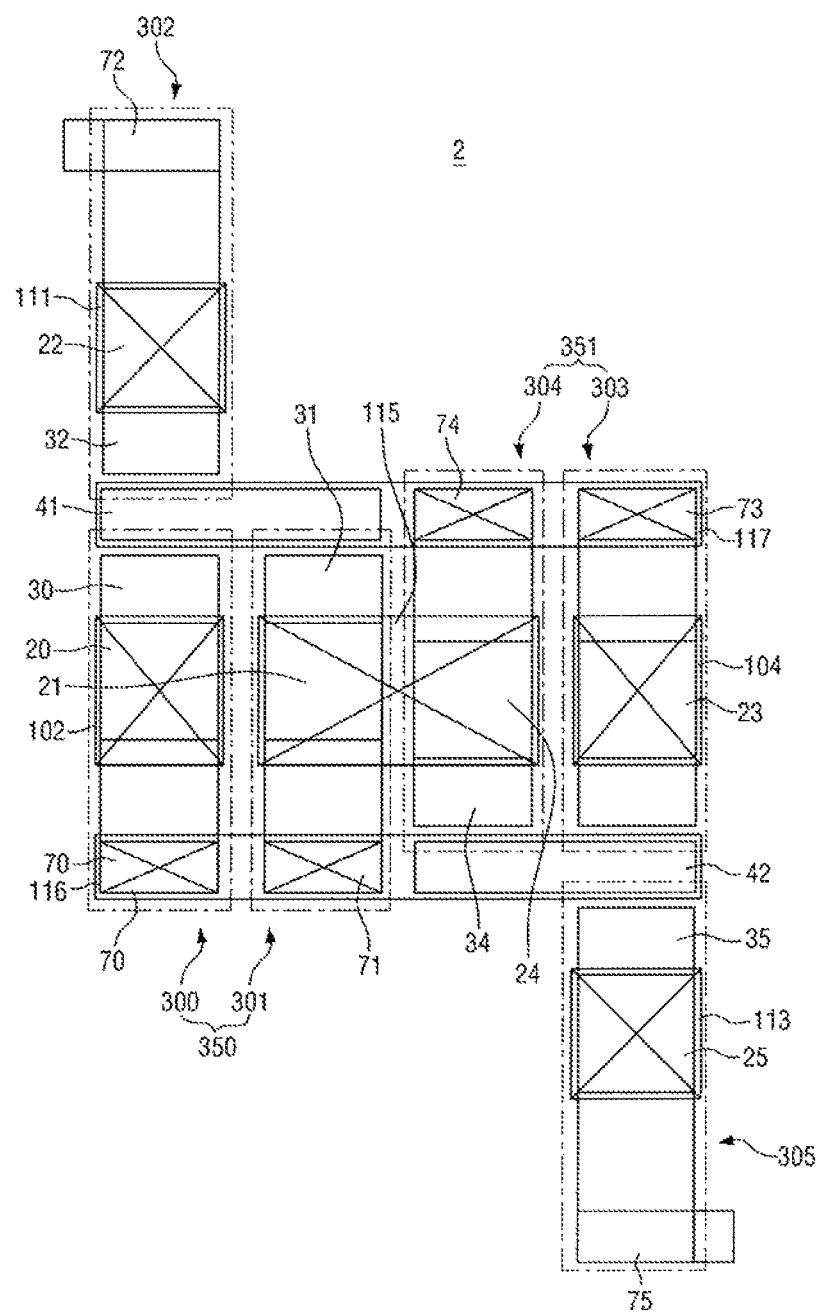
FIG. 5 is a layout diagram of a semiconductor device according to an exemplary embodiment of the present inventive concept.
Figure 6:
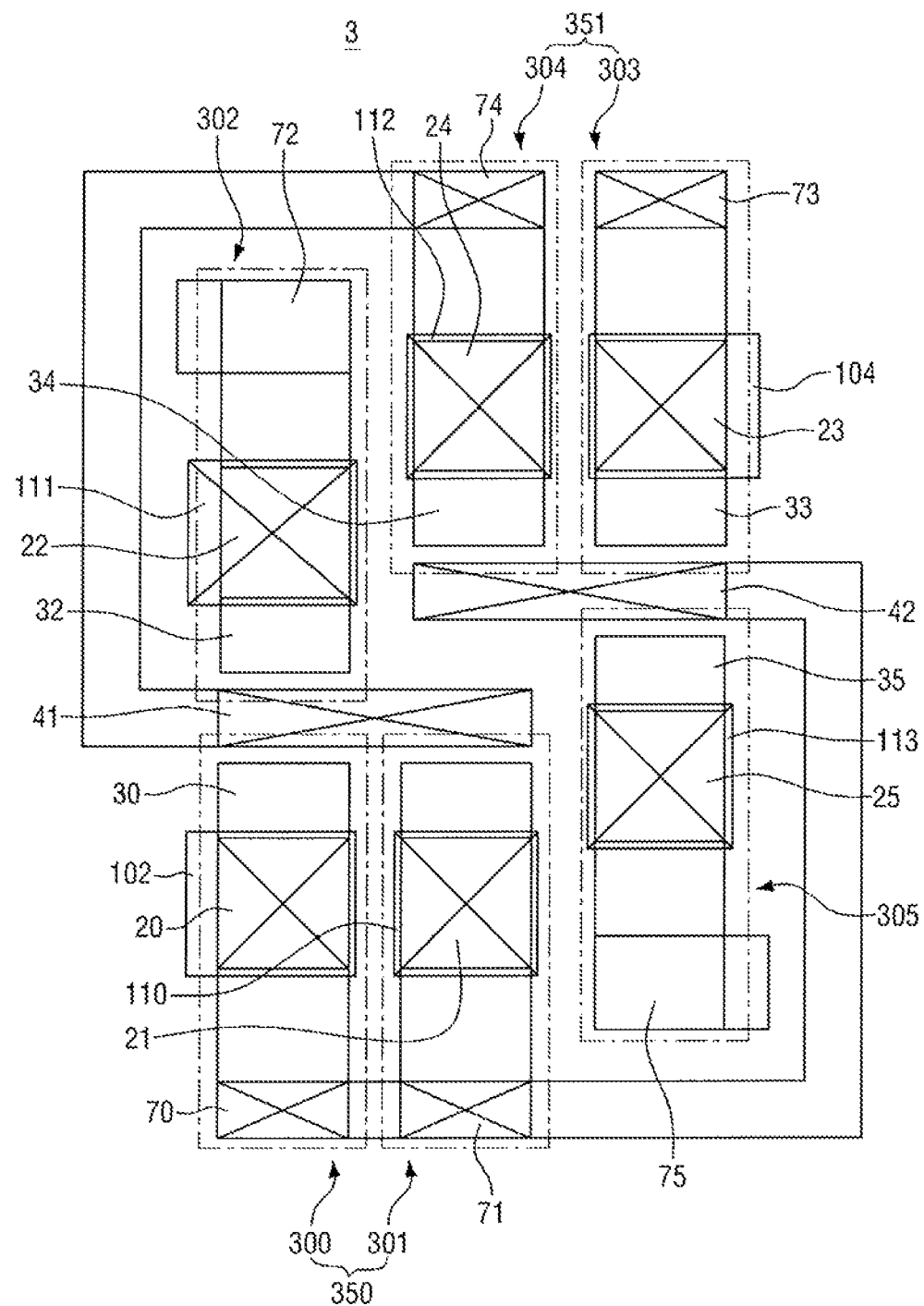
FIGS. 6 and 7 are layout diagrams of a semiconductor device according to exemplary embodiments of the present inventive concept.
Figure 7:
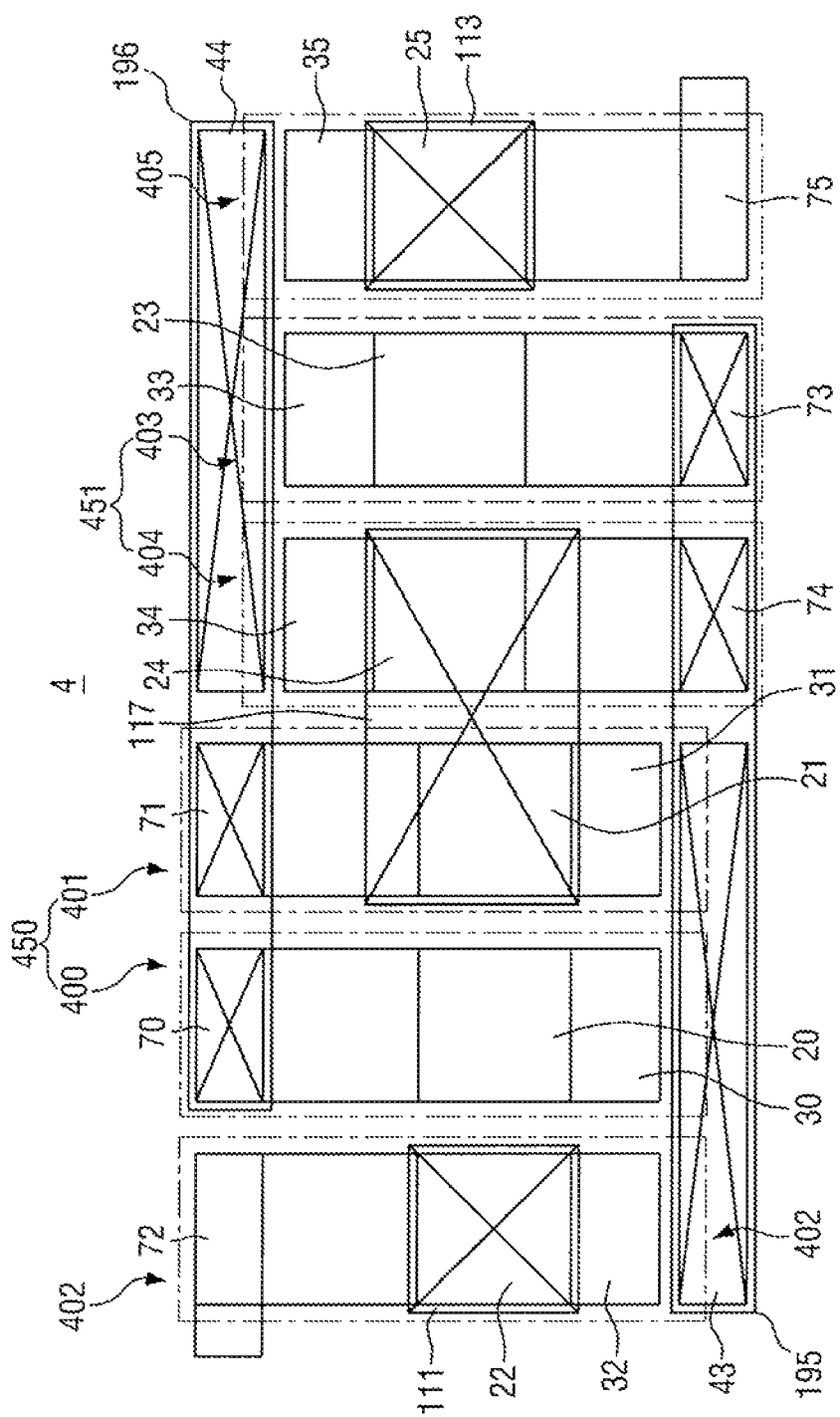

FIGS. 5 to 7 are layout diagrams of a semiconductor device according to exemplary embodiments of the present inventive concept. For convenience of explanation, a further description of components previously described may be omitted herein.

Referring to FIG. 5, a semiconductor device 2 according to an exemplary embodiment of the present inventive concept may have a layout different from that of the semiconductor device 1 according to the exemplary embodiment of the present inventive concept described with reference to FIGS. 1 to 4.

For example, the second inverter 351 may be arranged substantially in parallel with the first inverter 350 such that the second inverter 351 and the first inverter 350 are substantially adjacent with each other.

In this case, a node 117 that connects a gate contact 73 of the second pulldown transistor 303, a gate contact 74 of the second pullup transistor 304, and the first common drain 41 may be formed in a substantially straight line.

Similarly, a node 116 that connects the second common drain 42, a gate contact 70 of the first pulldown transistor 300, and a gate contact 71 of the first pullup transistor 301 may be formed in a substantially straight line.

A source electrode 21 of the first pullup transistor 301 and the source electrode 24 of the second pull transistor 304 may be electrically connected to the power node VCC through a source contact 115.

Referring again to FIG. 3, in an exemplary embodiment, the first gate contact 70, the first pattern 50, and the second pattern 41 may be sequentially disposed in the second direction Y. Alternatively, in an exemplary embodiment, the first pattern 50, the first gate contact 70, and the second pattern 41 may be sequentially disposed in the second direction Y.

Referring to FIG. 6, in a semiconductor device 3 according to an exemplary embodiment of the present inventive concept, the second inverter 351 is arranged adjacent to the first pass transistor 302. For example, the second inverter 351 may be arranged directly to the first pass transistor 302 (e.g., no other elements present in the semiconductor device 3 may be disposed between the second inverter 351 and the first pass transistor 302). In this case, the second pass transistor 305 may be arranged adjacent to the first inverter 350. For example, the second pass transistor 305 may be arranged directly adjacent to the first inverter 350 (e.g., no other elements present in the semiconductor device 3 may be disposed between the second pass transistor 305 and the first inverter 350). Thus, the first inverter 350 and the first pass transistor 302 are engaged with each other and the second inverter 351 and the second pass transistor 305 are engaged with each other.

Referring to FIG. 7, a semiconductor device 4 according to an exemplary embodiment of the present inventive concept may include a third pulldown transistor 400, a third pullup transistor 401, a third pass transistor 402, a fourth pulldown transistor 403, a fourth pullup transistor 404 and a fourth pass transistor 405.

In the semiconductor devices 1, 2 and 3 described above, the first inverter 350 may be disposed at one side of the first common drain 41, and the first pass transistor 302 may be disposed at the other side of the first common drain 41.

However, in the semiconductor device 4 of FIG. 7, a third inverter 450 and the third pass transistor 402 may be disposed together at one side of a third common drain 43. Furthermore, a fourth inverter 451 and the fourth pass transistor 405 may be disposed together at one side of a fourth common drain 44.

The third pulldown transistor 400, the third pullup transistor 401 and the third pass transistor 402 may include first, second and third gate contacts 70, 71 and 72 on respective gates 30, 31 and 32 thereof.

The first, second and third gate contacts 70, 71 and 72 may be disposed in a substantially straight line in a region in which the fourth common drain 44 extends in the second direction Y. That is, the first, second and third gate contacts 70, 71 and 72 may be substantially aligned with the fourth common drain 44 in the second direction, which is substantially vertical to the first direction (e.g., the first, second and third gate contacts 70, 71 and 72, and the fourth common drain 44, may be disposed substantially in a straight line in the second direction). Thus, a node 196 that connects the first and second gate contacts 70 and 71 and the fourth common drain 44 may be formed in a substantially straight line.

The fourth pulldown transistor 403, the fourth pullup transistor 404 and the fourth pass transistor 405 may include fourth, fifth and sixth gate contacts 73, 74 and 75 on respective gates 33, 34 and 35 thereof.

The fourth, fifth and sixth gate contacts 73, 74 and 75 may be disposed in a substantially straight line in a region in which the third common drain 43 extends in the second direction Y. That is, the fourth, fifth and sixth gate contacts 73, 74 and 75 may be substantially aligned with the third common drain 43. Thus, a node 195 that connects the fourth and fifth gate contacts 73 and 74 and the third common drain 43 may be formed in a substantially straight line.

Figure 8:
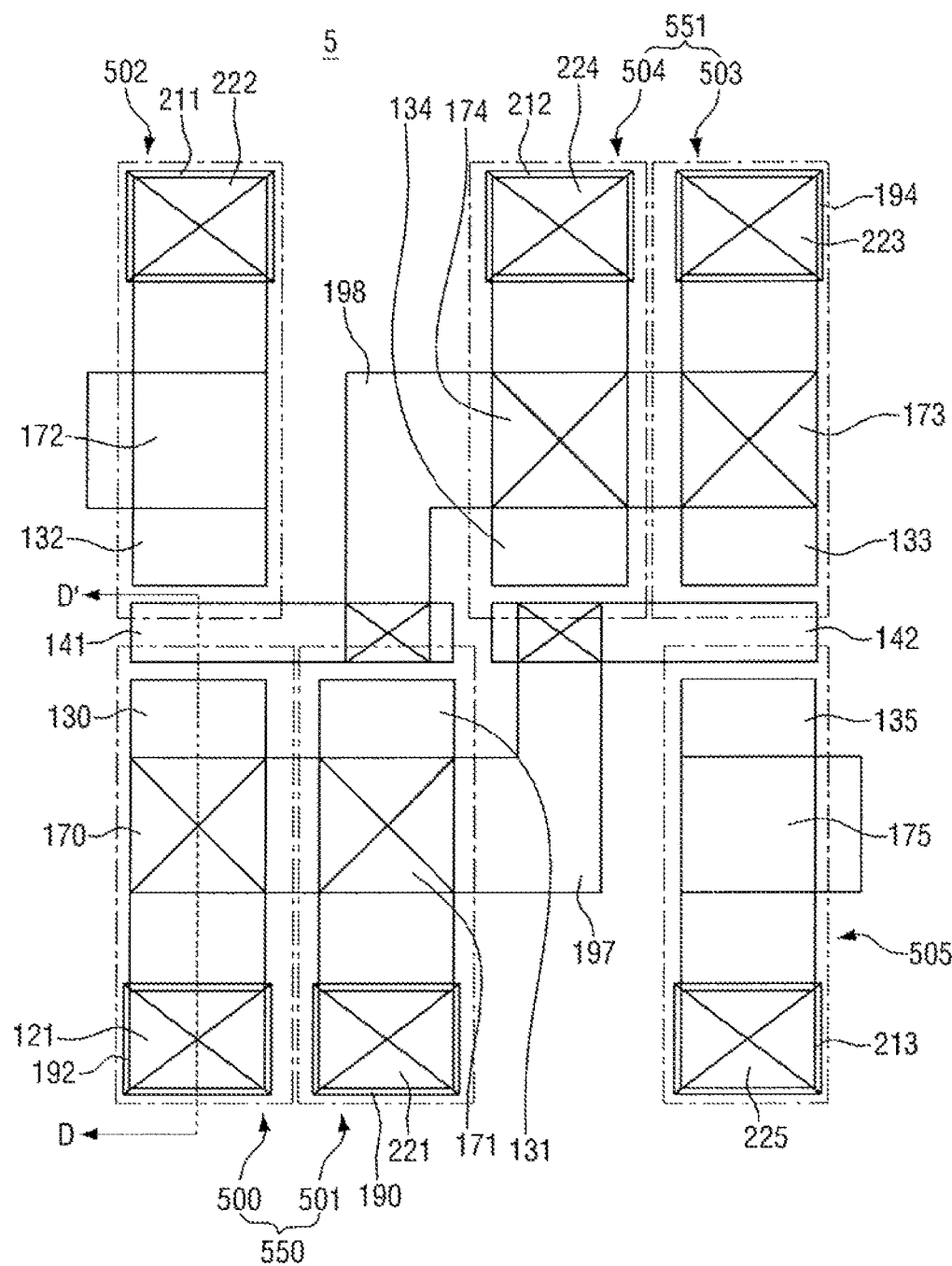
FIG. 8 is a layout diagram of a semiconductor device according to an exemplary embodiment of the present inventive concept.
Figure 9:
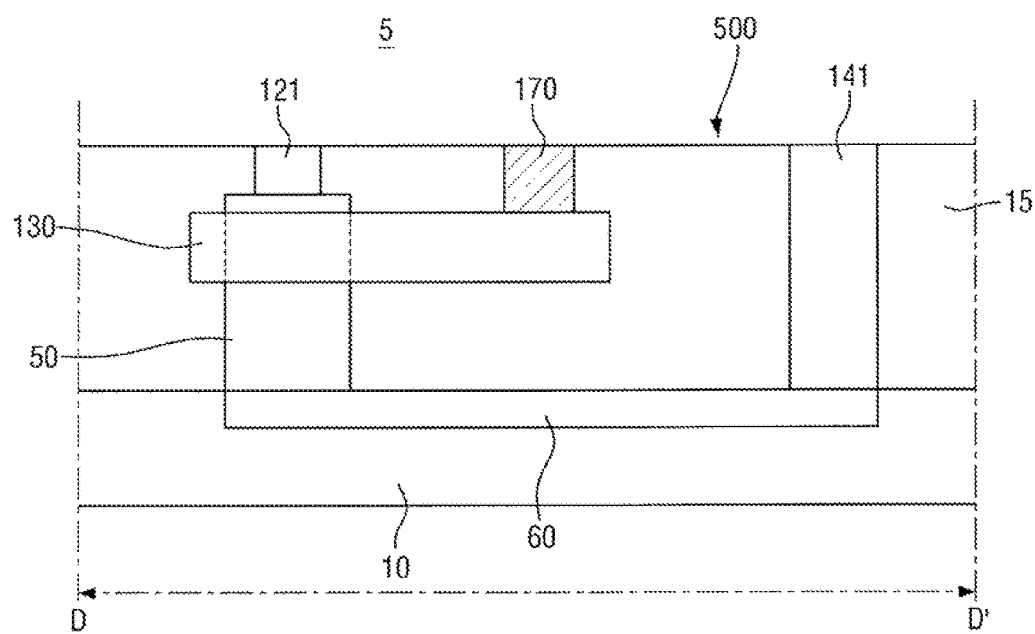
FIG. 9 is a cross-sectional view taken along line D-D' of FIG. 8 according to an exemplary embodiment of the present inventive concept.

FIG. 8 is a layout diagram of a semiconductor device according to an exemplary embodiment of the present inventive concept. FIG. 9 is a cross-sectional view taken along line D-D' of FIG. 8 according to an exemplary embodiment of the present inventive concept. For convenience of explanation, a further description of components previously described may be omitted herein.

A semiconductor device 5 may comprise a fifth inverter 550 including a fifth pulldown transistor 500 and a fifth pullup transistor 501, a sixth inverter 551 including sixth pulldown transistor 503 and a sixth pullup transistor 504, a fifth pass transistor 502 and a sixth pass transistor.

The semiconductor device 5 may have a gate contact 170 and a source electrode 121, which may be disposed at positions different from those of the semiconductor devices described above.

For example, in the case of the first pulldown transistor 300, components may be arranged in the order of the first gate contact 70, the first source electrode 20 and the second pattern, while in the case of the fifth pulldown transistor 500, components may be arranged in the order of the source electrode 121, the gate contact 170 and a fifth pattern 141.

The gate electrode 130 of the fifth pulldown transistor 500 may extend in a direction toward the fifth pattern 141. Thus, the gate contact 170 formed on the gate electrode 30 may be interposed between the first pattern 50 and the fifth pattern 141, and the gate contact 170 may be overlapped with the conductive region 60.

The fifth pattern 141 may be formed of a material substantially the same as that of the first pattern 50. The fifth pattern 141 may be a common drain of the fifth pulldown transistor 500 and the fifth pullup transistor 501.

The transistors 500, 501, 502, 503, 504, 505 of the semiconductor device 5 may comprise gate electrodes 130, 131, 132, 133, 134, 135 respectively.

A source contact 211 may be formed on a source electrode 222 of the fifth pass transistor 502. The source contact 211 may electrically connect the source electrode 222 of the fifth pass transistor 502 to the bitline node BL.

A source contact 213 may be formed on a source electrode 225 of the sixth pass transistor 505. The source contact 213 may electrically connect the source electrode 225 of the sixth pass transistor 505 to the complementary bitline node/BL.

Vias 211 and 213 may be disposed on a gate contact 172 of the fifth pass transistor 502 and a gate contact 175 of the sixth pass transistor 505, respectively. The vias 211 and 213 may connect the gate contacts 172 and 175 to the wordline WL.

The gate contact 170 of the fifth pulldown transistor 500 and a gate contact 171 of the fifth pullup transistor 501 may be electrically connected to a sixth common drain 142 through a third node 197. A gate contact 173 of the sixth pulldown transistor 503 and a gate contact 174 of the sixth pullup transistor 504 may be electrically connected to a fifth common drain 141 through a fourth node 198.

The source electrode 121 of the fifth pulldown transistor 500 and a source electrode 223 of the sixth pulldown transistor 503 may be connected to the ground node VSS through source contacts 192, 194. A source electrode 221 of the fifth pullup transistor 501 and a source electrode 224 of the sixth pullup transistor 504 may be connected to the power voltage node VCC through source contacts 190, 212.

When forming an SRAM cell, the semiconductor device 5 according to an exemplary embodiment of the present inventive concept can be used to satisfy a required layout of the SRAM cell being formed. Thus, an SRAM cell area and a layout design can be improved.

FIGS. 10 to 14 are diagrams illustrating process steps of a method of fabricating a semiconductor device according to an exemplary embodiment of the present inventive concept. For convenience of explanation, a further description of components previously described may be omitted herein.

Figure 10:
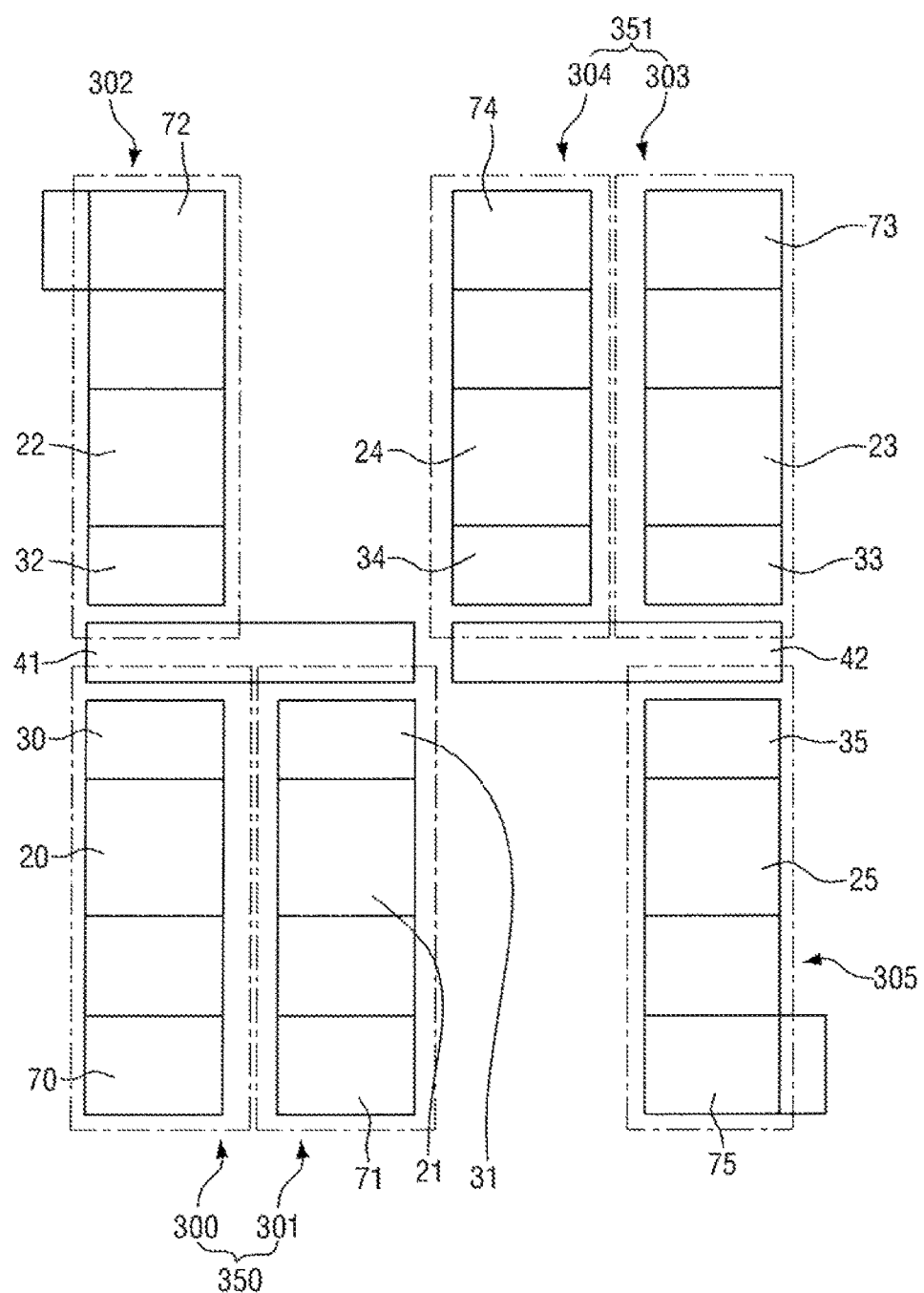
FIGS. 10 to 14 are diagrams illustrating intermediate process steps of a method of fabricating the semiconductor device according to an exemplary embodiment of the present inventive concept.
Figure 11:
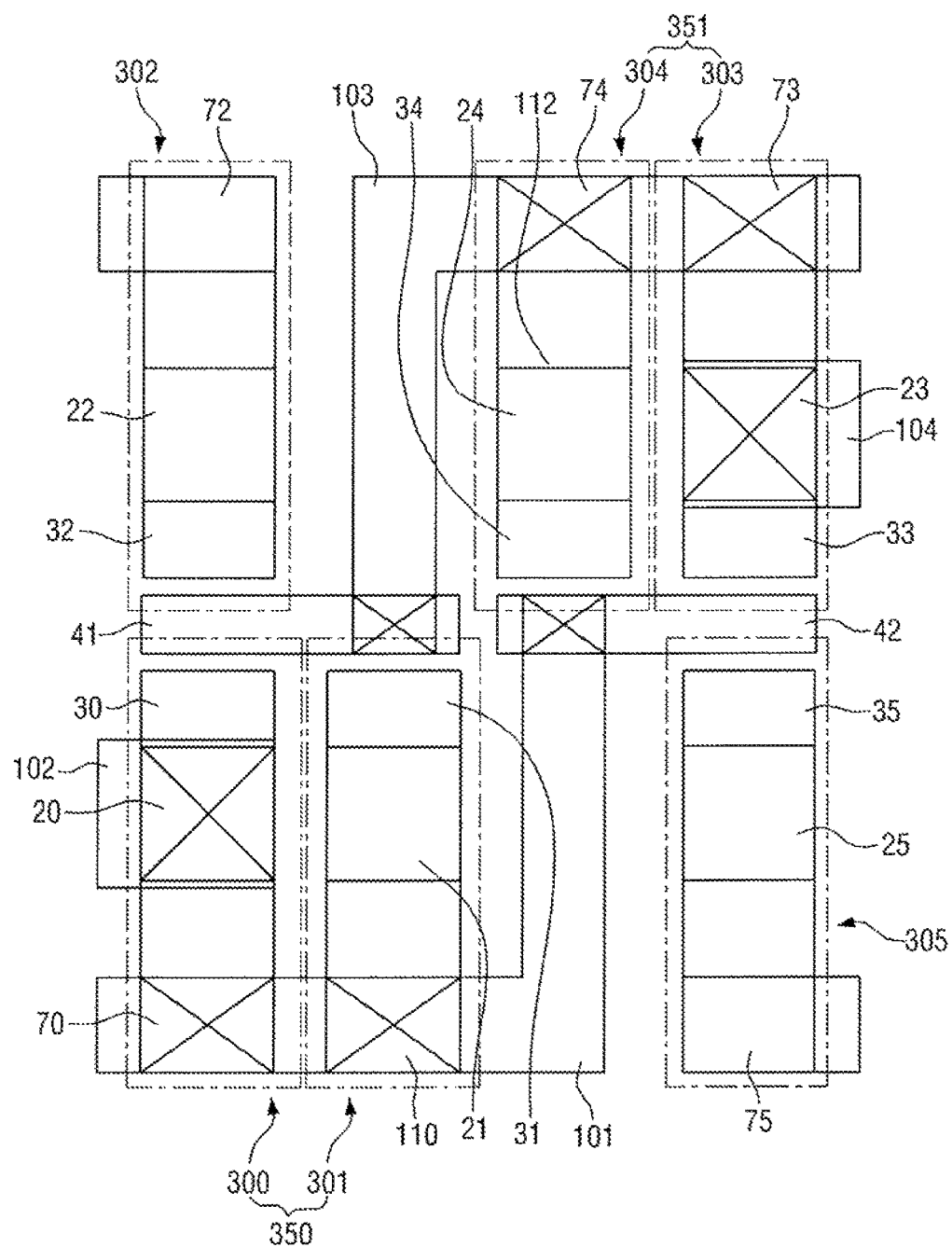

Referring to FIGS. 10 and 11, the first pulldown transistor 300, the first pullup transistor 301, the first pass transistor 302, the second pulldown transistor 303, the second pullup transistor 304 and the second pass transistor 305 may be formed. Then, the first and second gate contacts 70 and 71 and the second common drain 41 may be connected through a first node 101. Furthermore, the fourth and fifth gate contacts 73 and 74 and the first common drain 41 may be connected through a second node 103.

Figure 12:
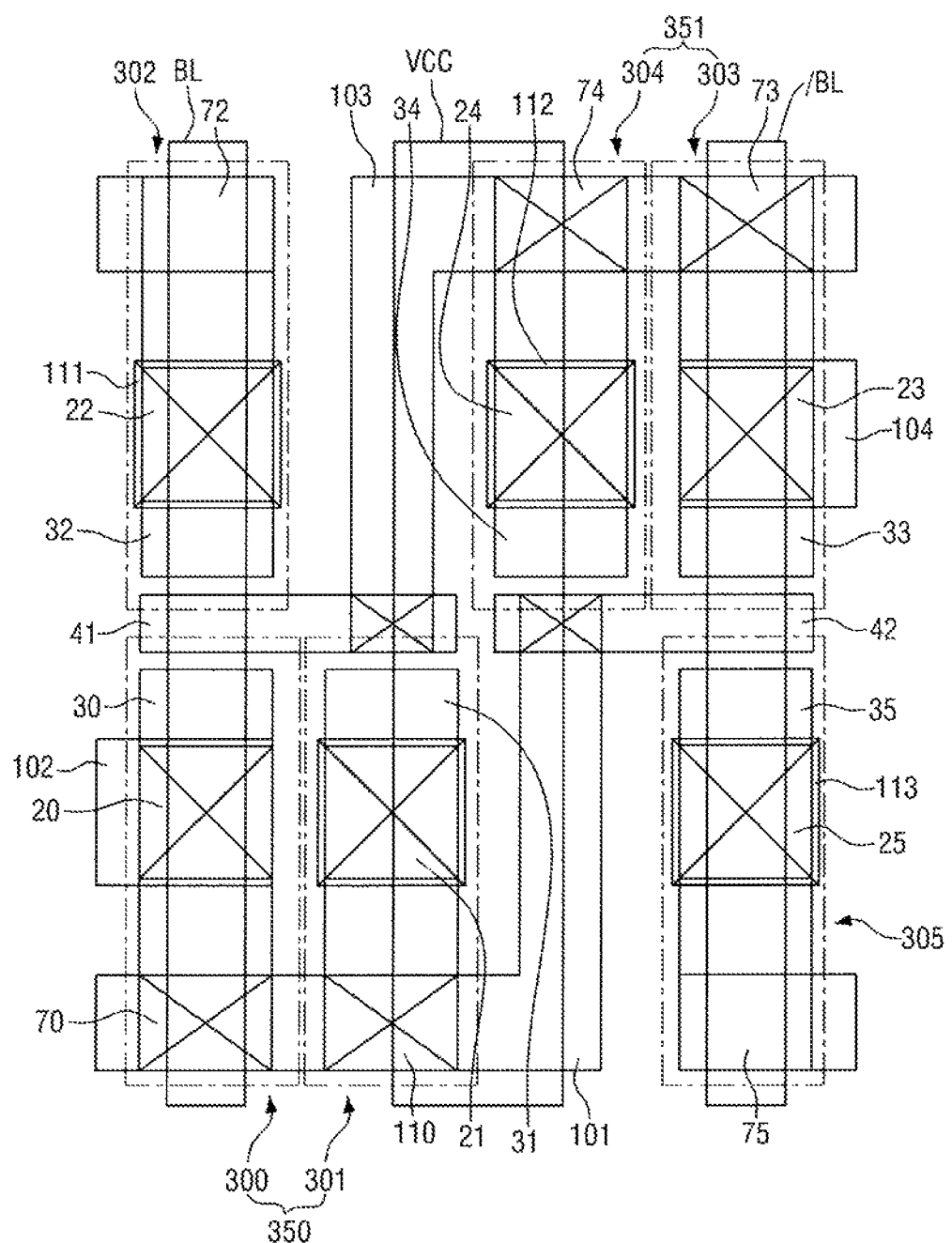

Referring to FIG. 12, the bitline node BL may be connected to source electrodes 20 and 22 of the respective first pulldown transistor 300 and the first pass transistor 302, and the complementary bitline/BL may be connected to source electrodes 23 and 25 of the respective second pulldown transistor 303 and the second pass transistor 305. Furthermore, the power voltage node VCC may be connected to source electrodes 21 and 24 of the respective first pullup transistor 301 and the second pullup transistor 304.

Figure 13:
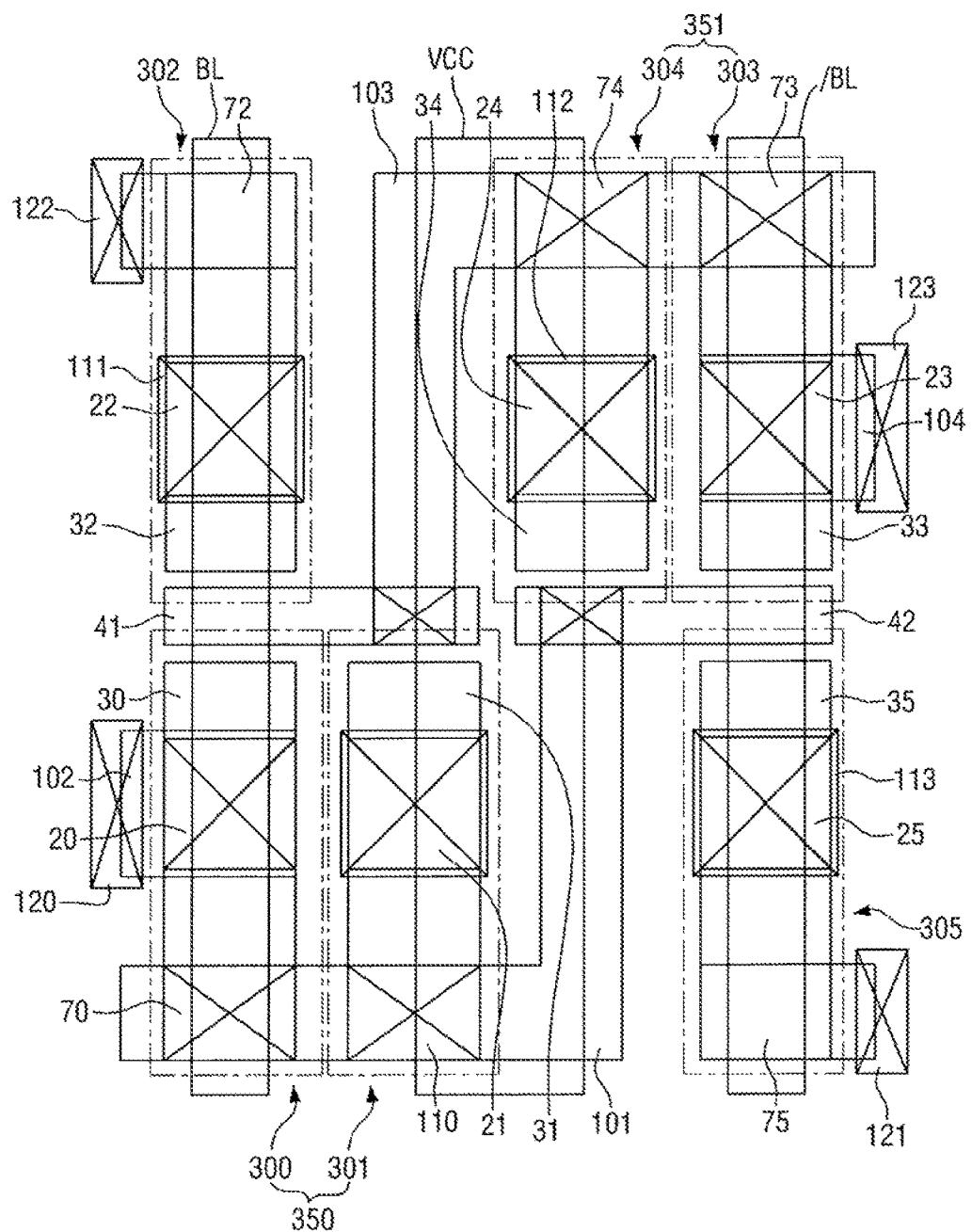
Figure 14:
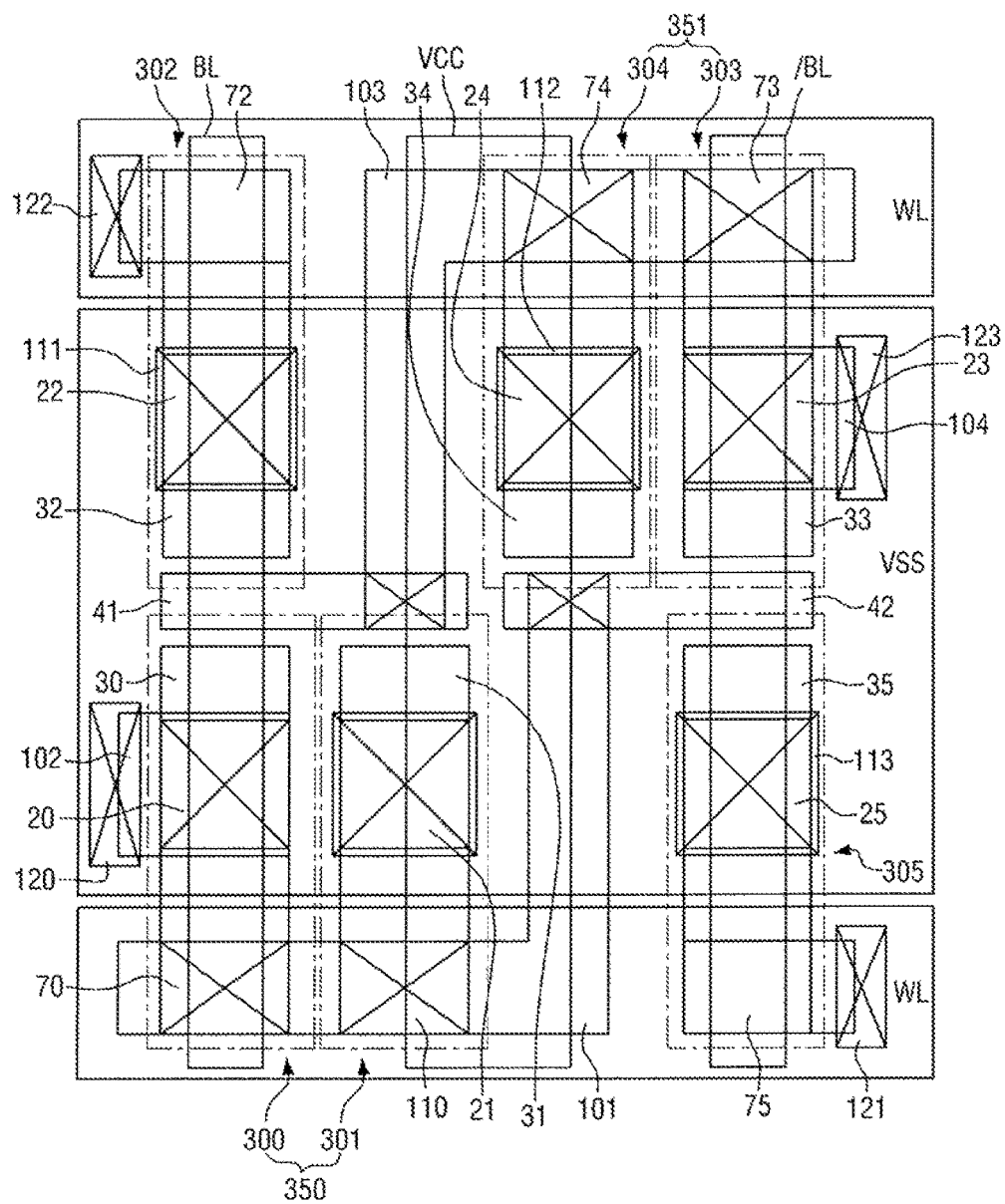

Referring to FIGS. 13 and 14, vias 121 and 122 may be formed in gate contacts 72 and 75 of the first pass transistor 302 and the second pass transistor 305, respectively, and the wordline WL may be connected thereto.

Vias 120 and 123 are formed on a source contact 102 of the first pulldown transistor 300 and a source contact 104 of the second pulldown transistor 303 respectively, and the vias 120 and 123 and the ground node VSS are connected with each other.

Figure 15:
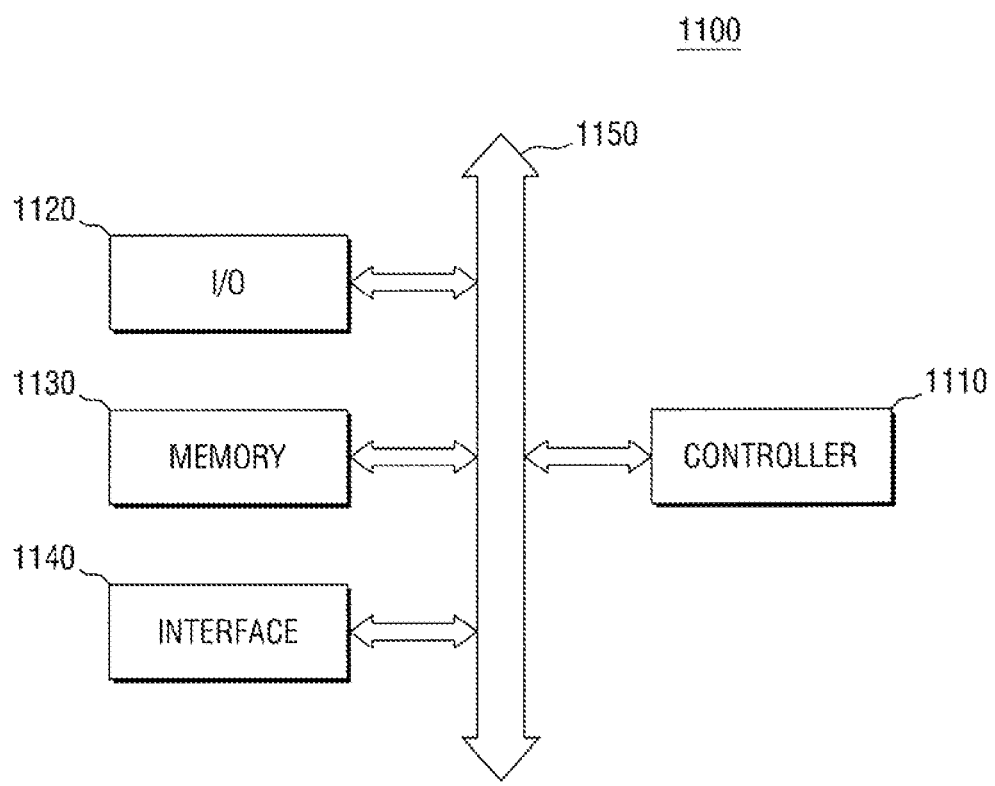
FIG. 15 is a block diagram illustrating an electronic system including semiconductor devices according to exemplary embodiments of the present inventive concept.

FIG. 15 is a block diagram illustrating an electronic system including at least one semiconductor device according to the exemplary embodiments of the present inventive concept.

Referring to FIG. 15, an electronic system 1100 according to an exemplary embodiment of the present inventive concept may include a controller 1110, an input/output (I/O) device 1120, a memory device 1130, an interface 1140 and a bus 1150. The controller 1110, the input/output (I/O) device 1120, the memory device 1130 and/or the interface 1140 may be coupled with one another through the bus 1150. The bus 1150 may serve as a path for data movement.

The controller 1110 may include, for example, at least one of a microprocessor, a digital signal processor, a microcontroller, and logic elements capable of performing functions similar to those of the microprocessor, the digital signal processor, and the microcontroller. The input/output device 1120 may include, for example, a keypad, a keyboard, a display device, etc. The memory device 1130 may store data and/or instructions therein. The interface 1140 may perform the function of transmitting data to a communication network or receiving data from the communication network. The interface 1140 may be of a wired or wireless type. For example, the interface 1140 may include an antenna, a wired/wireless transceiver, etc.

The electronic system 1100 may further include high speed DRAM and/or SRAM as an operation memory for improving an operation of the controller 1110. In this case, the above-described semiconductor devices according to the exemplary embodiments of the present inventive concept may be employed as the operation memory, which may improve reliability of products.

The above-described semiconductor devices according to the exemplary embodiments of the present inventive concept may be provided within the memory device 1130, or provided as a part of the controller 1110, the input/output device 1120, etc.

The electronic system 1100 can be applied to, for example, a personal digital assistant (PDA), a portable computer, a web tablet, a wireless phone, a mobile phone, a digital music player, a memory card, or any electronic product that can transmit and/or receive information in a wired or wireless environment.

Figure 16:
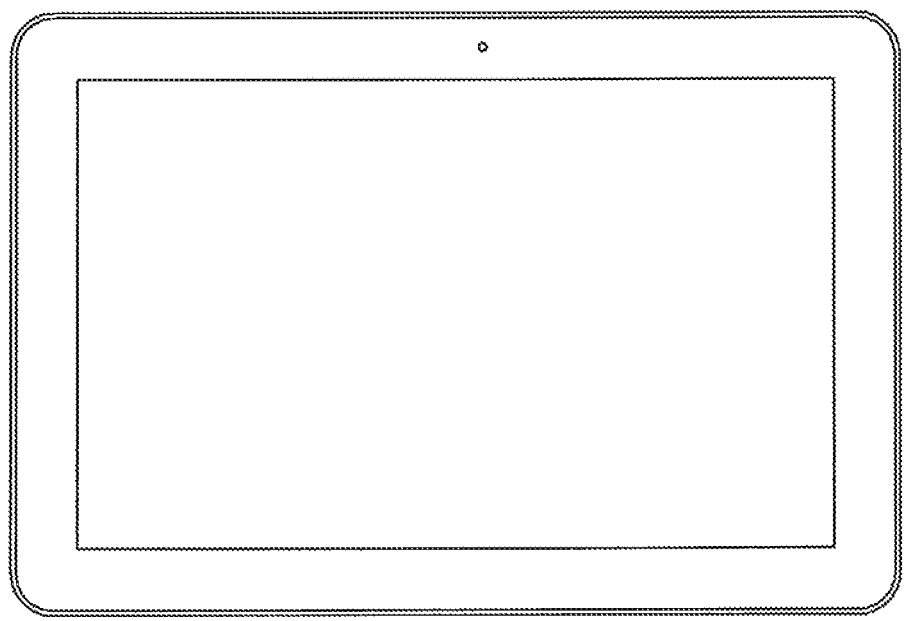
FIGS. 16 to 18 are diagrams illustrating examples of semiconductor systems to which semiconductor devices according to exemplary embodiments of the present inventive concept can be applied.
Figure 17:
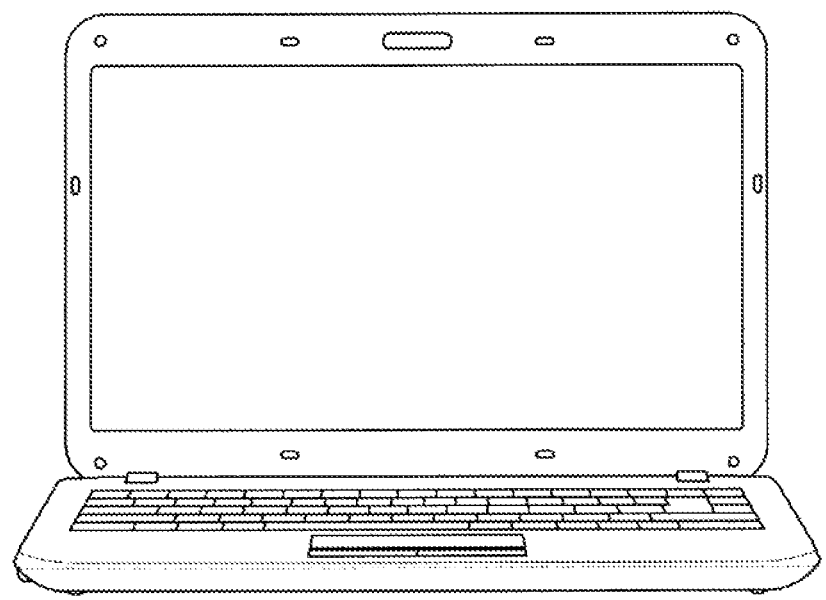
Figure 18:
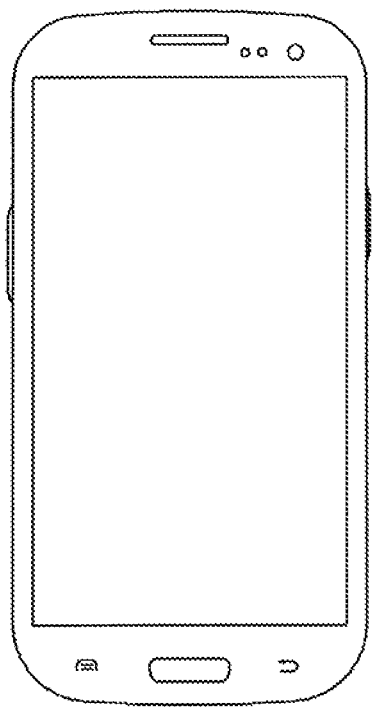

FIGS. 16 to 18 are diagrams illustrating examples of semiconductor systems to which semiconductor devices according to exemplary embodiments of the present inventive concept can be applied.

FIG. 16 illustrates a tablet PC 1200, FIG. 17 illustrates a notebook 1300, and FIG. 18 illustrates a smartphone 1400. At least one of the above-described semiconductor devices according to the exemplary embodiments of the present inventive concept can be used in the tablet PC 1200, the notebook 1300, and the smartphone 1400.

Semiconductor devices fabricated by a method of fabricating semiconductor devices according to exemplary embodiments of the present inventive concept may be applied to other integrated circuit devices which are not illustrated herein.

That is, although only the tablet PC 1200, the notebook 1300 and the smartphone 1400 are described above as examples of the semiconductor system according to exemplary embodiments of the present inventive concept, examples of the semiconductor system according to exemplary embodiment of the present inventive concept are not limited thereto.

For example, in exemplary embodiments of the present inventive concept, the semiconductor system may be implemented as a computer, an ultra mobile PC (UMPC), a workstation, a net book, a personal digital assistant (PDA), a portable computer, a wireless phone, a mobile phone, an e-book, a portable multimedia player (PMP), a portable gaming console, a navigation device, a black box, a digital camera, a 3-dimensional television, a digital audio recorder, a digital audio player, a digital picture recorder, a digital picture player, a digital video recorder, a digital video player, etc.

While the present inventive concept has been particularly shown and described with reference to the exemplary embodiments thereof, it will be understood by those of ordinary skill in the art that various changes in form and detail may be made therein without departing form the spirit and scope of the present inventive concept as defined by the following claims.

What is claimed is:

1. A semiconductor device, comprising:
a static random-access memory (SRAM) cell comprising a first pullup transistor, a first pulldown transistor and a first pass transistor formed on a substrate,
wherein the first pulldown transistor comprises a first pattern extending in a first direction substantially vertical to an upper surface of the substrate, a first gate electrode that covers a part of the first pattern, and a second pattern that does not contact the first gate electrode, that extends in the first direction and that has a first common drain formed therein,
wherein the first pullup transistor comprises a third pattern extending in the first direction, and a second gate electrode that covers a part of the third pattern,
wherein the first pass transistor comprises a fourth pattern extending in the first direction, and a third gate electrode that covers a part of the fourth pattern,
wherein the first pattern and the third pattern are spaced apart in a second direction intersecting the first direction,
wherein the first pattern and the fourth pattern are spaced apart in a third direction intersecting the first direction and the second direction, and
wherein the first pullup transistor, the first pulldown transistor and the first pass transistor share the second pattern.

2. The semiconductor device of claim 1,
wherein the first pullup transistor and the first pulldown transistor are disposed at one side of the second pattern,
wherein the first pass transistor is disposed at another side of the second pattern that faces the one side of the second pattern.

3. The semiconductor device of claim 2, further comprising:
a second pullup transistor, a second pulldown transistor and a second pass transistor,
wherein the second pulldown transistor comprises a fifth pattern extending in the first direction, a fourth gate electrode that covers a part of the fifth pattern, and a sixth pattern that does not contact the fourth gate electrode, that extends in the first direction, and that has a second common drain formed therein,
wherein the second pullup transistor, the second pulldown transistor and the second pass transistor share the sixth pattern.

4. The semiconductor device of claim 3,
wherein the second pullup transistor and the second pulldown transistor are disposed at one side of the sixth pattern,
wherein the sixth pattern is disposed adjacent to the second pattern, and the sixth pattern and the second pattern are disposed in a substantially straight line in the second direction that extends substantially vertical to the first direction.

5. The semiconductor device of claim 3, wherein the second pulldown transistor comprises a first gate contact formed on the fourth gate electrode,
wherein the second pullup transistor comprises a fifth gate electrode, and a second gate contact formed on the fifth gate electrode,
wherein the first gate electrode, the second gate contact, and the sixth pattern are disposed in a substantially straight line in the second direction that extends substantially vertical to the first direction.

6. The semiconductor device of claim 3, wherein the first pass transistor is disposed adjacent to one side of the second pullup transistor, and the second pass transistor is disposed adjacent to one side of the first pullup transistor.

7. The semiconductor device of claim 3, further comprising:
- a third pulldown transistor comprising a fifth gate electrode, and a first gate contact formed on the fifth gate electrode;
- a third pullup transistor comprising a sixth gate electrode, and a second gate contact formed on the sixth gate electrode; and
- a third pass transistor comprising a seventh gate electrode, and a third gate contact formed on the seventh gate electrode,
  - wherein the first pullup transistor, the first pulldown transistor and the first pass transistor are disposed at one side of the second pattern,
  - wherein the first gate contact, the second gate contact, the third gate contact, and the second pattern are disposed substantially in a straight line in the second direction that extends substantially vertical to the first direction.

8. A semiconductor device, comprising:
- a first pulldown transistor disposed on a substrate, wherein the first pulldown transistor comprises a first pattern that extends in a first direction substantially vertical to an upper surface of the substrate, a first gate electrode that covers a part of the first pattern, and a second pattern that does not contact the first gate electrode, that extends in the first direction, and that has a first common drain formed therein;
- a first pullup transistor;
- a first pass transistor sharing the second pattern with the first pulldown transistor and the first pinup transistor; and
- a second pass transistor arranged in parallel with the first pulldown transistor and the first pullup transistor in a second direction crossing the first direction,
- wherein a distance between the first pullup transistor and the first pulldown transistor is smaller than a distance between the first pullup transistor and the second pass transistor,
- wherein the first pullup transistor comprises a third pattern that extends in the first direction, and a second gate electrode that covers a part of the third pattern, and
- wherein the first gate electrode and the second gate electrode are spaced apart from each other in the second direction.

9. The semiconductor device of claim 8, wherein the second pass transistor comprises a fifth pattern that extends in the first direction, a third gate electrode that covers a part of the fifth pattern, and a fourth pattern that does not contact the third gate electrode, that extends in the first direction, and that has a second common drain formed therein.

10. The semiconductor device of claim 9, further comprising:
- a second pulldown transistor; and
- a second pullup transistor that shares the fourth pattern with the second pulldown transistor and the second pass transistor, wherein the first pass transistor is arranged in parallel with the second pulldown transistor and the second pullup transistor in the second direction.

11. The semiconductor device of claim 10, wherein a distance between the second pullup transistor and the first pass transistor is larger than a distance between the second pullup transistor and the second pulldown transistor.

12. The semiconductor device of claim 10, wherein the first pass transistor and the first pulldown transistor are arranged in a third direction crossing the first direction and the second direction, and wherein the second pass transistor and the second pulldown transistor are arranged in the third direction.

13. The semiconductor device of claim 9, wherein the second pattern and the fourth pattern are arranged in the second direction.

14. A semiconductor device, comprising:
- a first pulldown transistor disposed on a substrate, wherein the first pulldown transistor comprises a first pattern that extends in a first direction substantially vertical to an upper surface of the substrate, a first gate electrode that covers a part of the first pattern, and a second pattern that does not contact the first gate electrode, that extends in the first direction, and that has a first common drain formed therein;
- a first pullup transistor;
- a first pass transistor sharing the second pattern with the first pulldown transistor and the first pullup transistor; and
- a second pass transistor arranged in parallel with the first pulldown transistor and the first pullup transistor in a second direction crossing the first direction,
- wherein the first pulldown transistor, the first pullup transistor, and the second pass transistor are arranged in the second direction,
- wherein the first pullup transistor and the first pulldown transistor are disposed at one side of the second pattern,
- wherein the first pass transistor is disposed at another side of the second pattern that faces the one side of the second pattern.

15. The semiconductor device of claim 14, wherein the first pullup transistor comprises a third pattern extending the first direction, and a second gate electrode that covers a part of the third pattern,
- wherein the second pass transistor comprises a fourth pattern extending the first direction and a third gate electrode that covers a part of the fourth pattern, and
- wherein a center axis of the first pattern, a center axis of the third pattern and a center axis of the fourth pattern are arranged in a straight line in the second direction in a plan view,
- wherein the center axes of the first pattern, the third pattern, and the fourth pattern penetrate the respective patterns in the first direction.

16. The semiconductor device of claim 15, wherein the first pulldown transistor comprises a first source electrode on the first pattern,
- wherein the first pullup transistor comprises a second source electrode on the third pattern,
- wherein the second pass transistor comprises a third source electrode on the third pattern, and
- wherein the first source electrode, the second source electrode and the third source electrode are arranged in the second direction.

17. The semiconductor device of claim 15, wherein the second pass transistor comprises a fifth pattern that does not contact the third gate electrode, that extends in the first direction, and that has a second common drain formed therein.

18. The semiconductor device of claim 17, further comprising:
- a second pulldown transistor; and
- a second pullup transistor that shares the fifth pattern with the second pulldown transistor and the second pass transistor, wherein the first pass transistor is arranged in parallel with the second pulldown transistor and the second pullup transistor in the second direction.

* * * * *